(12) United States Patent
Hattori

(10) Patent No.: US 10,908,989 B2
(45) Date of Patent: Feb. 2, 2021

(54) VARIABLE RESISTANCE RANDOM-ACCESS MEMORY AND METHOD FOR WRITE OPERATION HAVING ERROR BIT RECOVERING FUNCTION THEREOF

(71) Applicant: Winbond Electronics Corp., Taichung (TW)

(72) Inventor: Norio Hattori, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/431,739

(22) Filed: Jun. 5, 2019

(65) Prior Publication Data

US 2019/0377631 A1 Dec. 12, 2019

(30) Foreign Application Priority Data

Jun. 8, 2018 (JP) ................................ 2018-109926

(51) Int. Cl.
*G06F 11/10* (2006.01)
*G11C 13/00* (2006.01)

(52) U.S. Cl.
CPC ........ *G06F 11/1012* (2013.01); *G11C 13/004* (2013.01); *G11C 13/0026* (2013.01);
(Continued)

(58) Field of Classification Search
CPC . G11C 13/0033; G11C 13/0035; G11C 29/52; G11C 2029/0411; G11C 13/004;
(Continued)

(56) References Cited

U.S. PATENT DOCUMENTS

2011/0214025 A1* 9/2011 Seko .................. G11C 13/0061
714/720
2017/0277442 A1* 9/2017 Fujinami ............ G11C 16/3431
(Continued)

FOREIGN PATENT DOCUMENTS

CN 107430558 12/2017
JP 2008041704 2/2008
(Continued)

OTHER PUBLICATIONS

"Office Action of Taiwan Counterpart Application," dated Nov. 12, 2019, p. 1-p. 7.
(Continued)

*Primary Examiner* — Guy J Lamarre
(74) *Attorney, Agent, or Firm* — JCIPRNET

(57) ABSTRACT

Provided is a variable resistance random-access memory for suppressing degradation of performance by recovering a memory cell that fails. A variable resistance random-access memory of the disclosure includes a memory array, a row selection circuit, a column selection circuit, a controller, an error checking and correcting (ECC) circuit, an error bit flag register, and an error bit address register. The memory array includes a plurality of memory cells. The column selection circuit includes a sense amplifier and a write driver/read bias circuit. The error bit flag register stores bits for indicating presence/absence of an error bit in a write operation. The error bit address register stores an address of the error bit. The controller recovers the error bit when a predetermined event occurs.

20 Claims, 5 Drawing Sheets

(52) U.S. Cl.
CPC ...... *G11C 13/0028* (2013.01); *G11C 13/0035* (2013.01); *G11C 13/0069* (2013.01)

(58) Field of Classification Search
CPC ............ G11C 2213/79; G11C 13/0028; G11C 13/0064; G11C 2013/0073; G11C 13/0069; G11C 2213/82; G11C 13/0026; G06F 11/1048; G06F 11/1012
See application file for complete search history.

(56) References Cited

U.S. PATENT DOCUMENTS

2018/0101331 A1* 4/2018 Huff ..................... G06F 3/0619
2018/0158535 A1 6/2018 Kim et al.

FOREIGN PATENT DOCUMENTS

| | | |
|---|---|---|
| JP | 2010055699 | 3/2010 |
| JP | 2012064286 | 3/2012 |
| JP | 2014022004 | 2/2014 |
| JP | 2014041683 | 3/2014 |
| JP | 2015185191 | 10/2015 |
| JP | 2016100032 | 5/2016 |
| JP | 2016170848 | 9/2016 |

OTHER PUBLICATIONS

"Office Action of Japan Counterpart Application", dated May 7, 2019, with English translation thereof, pp. 1-5.

* cited by examiner

| | Bit line BL | Source line SL | Word line WL |
|---|---|---|---|
| Forming | Vf | GND | + |
| SET | + | GND | + |
| RESET | GND | + | + |

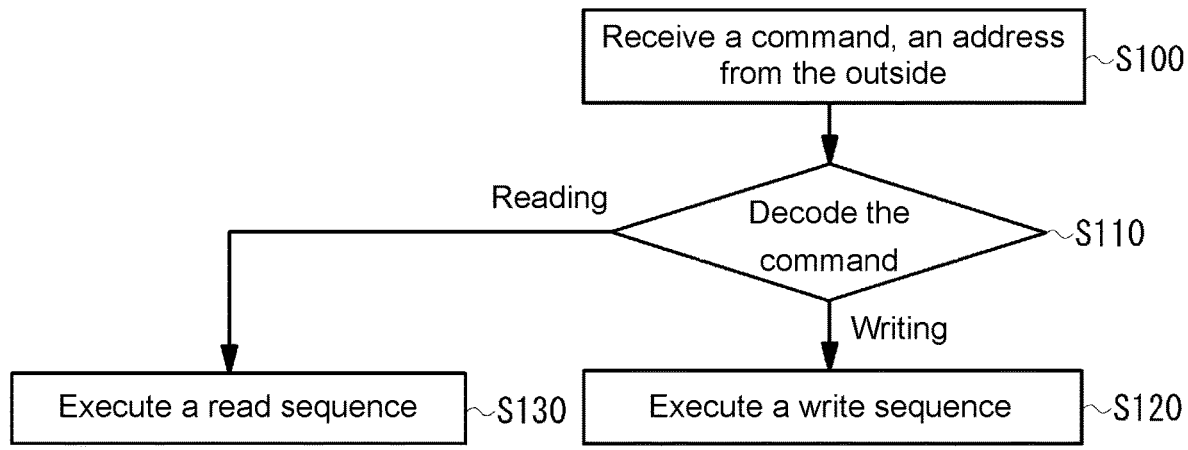
FIG. 4
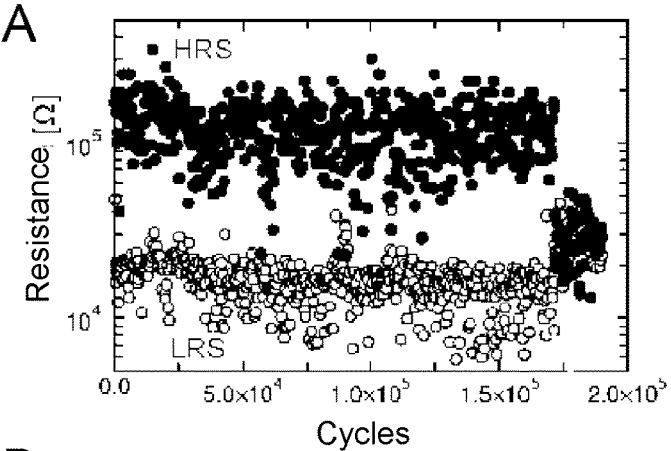
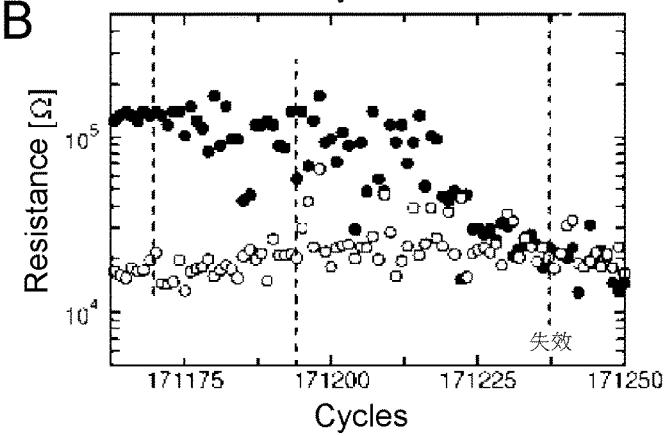

VARIABLE RESISTANCE RANDOM-ACCESS MEMORY AND METHOD FOR WRITE OPERATION HAVING ERROR BIT RECOVERING FUNCTION THEREOF

CROSS-REFERENCE TO RELATED APPLICATION

This application claims the priority benefit of Japan application serial no. 2018-109926, filed on Jun. 8, 2019. The entirety of the above-mentioned patent application is hereby incorporated by reference herein and made a part of this specification.

BACKGROUND

Technical Field

The disclosure relates to a semiconductor memory device, and more particularly to a variable resistance random-access memory using a variable resistance element.

Description of Related Art

A variable resistance memory stores data by applying a pulse voltage to a variable resistance element and setting the variable resistance element to a high resistance state or a low resistance state in a reversible and non-volatile manner. The variable resistance memory has the advantage that it can rewrite data at a low voltage, so the power consumption is low and the reading time is short (Patent Document 1: Japanese Laid-Open No. 2012-64286, Patent Document 2: Japanese Laid-Open No. 2008-41704, etc.).

FIG. 1A illustrates a memory array 10 of 3 rows×3 columns. Each memory cell MC is a so-called 1T×1R including one variable resistance element and one transistor connected in series to the variable resistance element. The variable resistance element includes a thin film of a transition metal oxide such as hafnium oxide ($HfO_x$), and the variable resistance element is set to the low resistance state or the high resistance state by changing the polarity or value of a write pulse voltage. In general, writing the variable resistance element to the low resistance state is called SET, and writing the variable resistance element to the high resistance state is called RESET.

FIG. 1B shows an example of bias voltages during the periods of Forming, SET and RESET. When the memory cell MC is accessed, the transistor of the memory cell MC is turned on via a word line WL(n) by a row decoder 20, and a pulse voltage corresponding to SET or RESET is applied via a bit line BL(n) and a source line SL(n) by a column decoder 30. In a read operation, a voltage or a current across the memory cell MC is detected by a sense circuit, and the variable resistance element of the memory cell MC is determined in the low resistance state or the high resistance state according to the voltage or the current across the memory cell MC.

In addition, the forming refers to applying a voltage somewhat higher than the voltage applied during SET to set the variable resistance element to the low resistance state.

FIG. 2 is a block diagram showing a schematic configuration of a conventional variable resistance memory. The variable resistance memory includes a controller 50, a main memory part 60, a sub-memory part 70, and an error checking and correcting (ECC) circuit 80, etc. The controller 50 receives a command, an address, etc. from the outside, to control a read operation and a write operation (SET/RE-SET). The main memory part 60 and the sub-memory part 70 both have a plurality of memory arrays including the variable resistance elements, the main memory part 60 stores data input from the outside at the time of the write operation, and the sub-memory part 70 stores code information, i.e. an error correction code for error detection/correction, generated by the ECC circuit 80.

When writing the input data to the main memory part 60, the ECC circuit 80 executes an ECC operation on the input data and generates the error correction code. When the input data is written, the error correction code is written to the sub-memory part 70 in association with the input data. Moreover, when the data is read from the main memory part 60, the error correction code is read from the sub-memory part 70, the ECC circuit 80 executes error detection and correction on the data read from the main memory part 60 in accordance with the error correction code, and the result is output to the outside as read data.

It is known that the state of the variable resistance element in the variable resistance memory becomes unstable as the SET/RESET write count (number of cycles) increases. In other words, the variable resistance element may not be changed to low resistance even SET writing executed and may not be changed to high resistance even RESET writing executed. When an error bit occurs, the ECC circuit 80 may guarantee accurate data.

If the processing capability of the ECC circuit 80 is increased, i.e. if the number of bits that can be corrected is increased, it is possible to recover a large number of error bits correspondingly. However, as the number of bits of the ECC circuit 80 that can be corrected is increased, the area occupied by the ECC circuit increases, and the performance of the variable resistance memory decreases due to the influence of the operation time etc. of the ECC circuit. Therefore, it is favorable that the number of bits corrected by the ECC circuit is as few as possible, and ultimately it is favorable that the ECC circuit is not mounted.

SUMMARY

In view of the above, the disclosure provides a variable resistance random-access memory which suppresses degradation of performance while recovering the memory cells that fail.

An embodiment of the disclosure relates to a variable resistance random-access memory. The variable resistance random-access memory includes a memory array, a controller, and a failure information holding element. The memory array includes a plurality of memory cells. The controller is configured to perform: writing a memory cell selected based on address information to be a predetermined resistance state; determining the written memory cell as pass if the written memory cell matches the predetermined resistance state or failure if the written memory cell does not match the predetermined resistance state; and recovering the written memory cell determined as failure based on the failure information when a predetermined event occurs. The failure information holding element is configured to hold failure information comprising an address of the written memory cell determined as failure.

An embodiment of the disclosure relates to a method for a write operation having the error bit recovering function of a variable resistance random-access memory. The method comprises writing a memory cell selected based on address information to be a predetermined resistance state; determining the written memory cell as pass if the written memory cell matches the predetermined resistance state or failure if the written memory cell does not match the predetermined resistance state; holding failure information comprising an address of the written memory cell determined as failure in a failure information holding element; and recovering the written memory cell determined as failure based on the failure information when a predetermined event occurs.

According to the disclosure, since the data of the memory cell determined as failure is rewritten when a predetermine event occurs, it is possible to recover the memory cell determined as failure. By recovering the memory cell determined as failure, the number of bits corrected by the error correction circuit can be reduced, and the deterioration of the performance of the variable resistance random-access memory caused by the error correction circuit can be suppressed.

BRIEF DESCRIPTION OF THE DRAWINGS

FIG. 4 is a diagram showing an example of a command processing sequence according to an embodiment of the disclosure.

FIG. 5A and FIG. 5B are graphs showing a relationship between a resistance state of a variable resistance memory and the number of write cycles.

DESCRIPTION OF THE EMBODIMENTS

A variable resistance random-access memory (refers to RRAM) exemplified in the disclosure may be composed of one chip or may be embedded in one chip.

Figure 3:
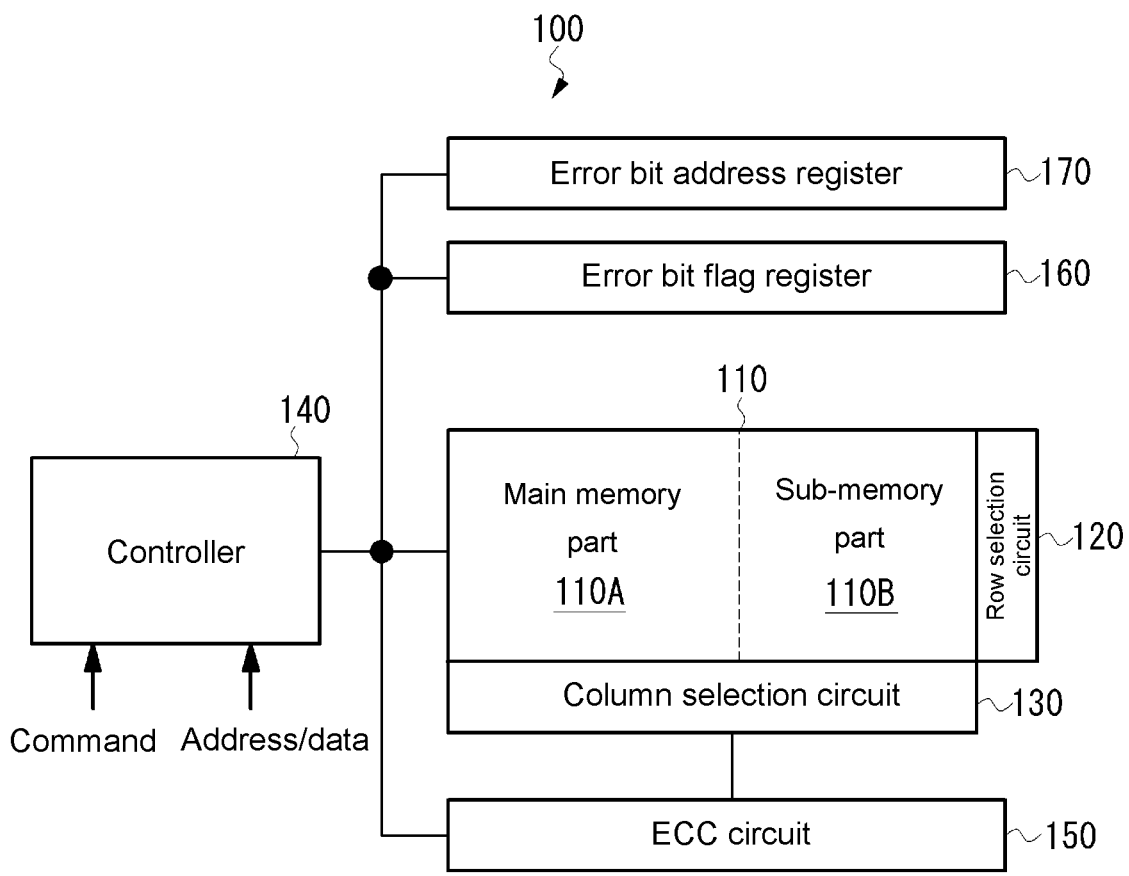
FIG. 3 is a block diagram showing a schematic configuration of a variable resistance random access memory according to an embodiment of the disclosure.

FIG. 3 is a block diagram showing a schematic configuration of a RRAM according to an embodiment of the disclosure. The RRAM 100 of this embodiment includes a memory array 110, a row selection circuit 120, a column selection circuit 130, a controller 140, an error checking and correcting (ECC) circuit 150, an error bit flag register 160, and an error bit address register 170. The memory array 110 has a plurality of memory cells arranged in rows and columns. The row selection circuit 120 selects a word line based on a row address. The column selection circuit 130 selects a bit line and a source line based on a column address and applies a corresponding bias voltage corresponding to an operation. The controller 140 controls each part of the RRAM 100 based on a command, an address, data, etc. received from the outside. The error bit flag register 160 stores flag data indicating presence or absence of a memory cell determined as having an error bit during a write operation. The error bit address register 170 stores an address of the error bit.

Figures 1A, 1B:
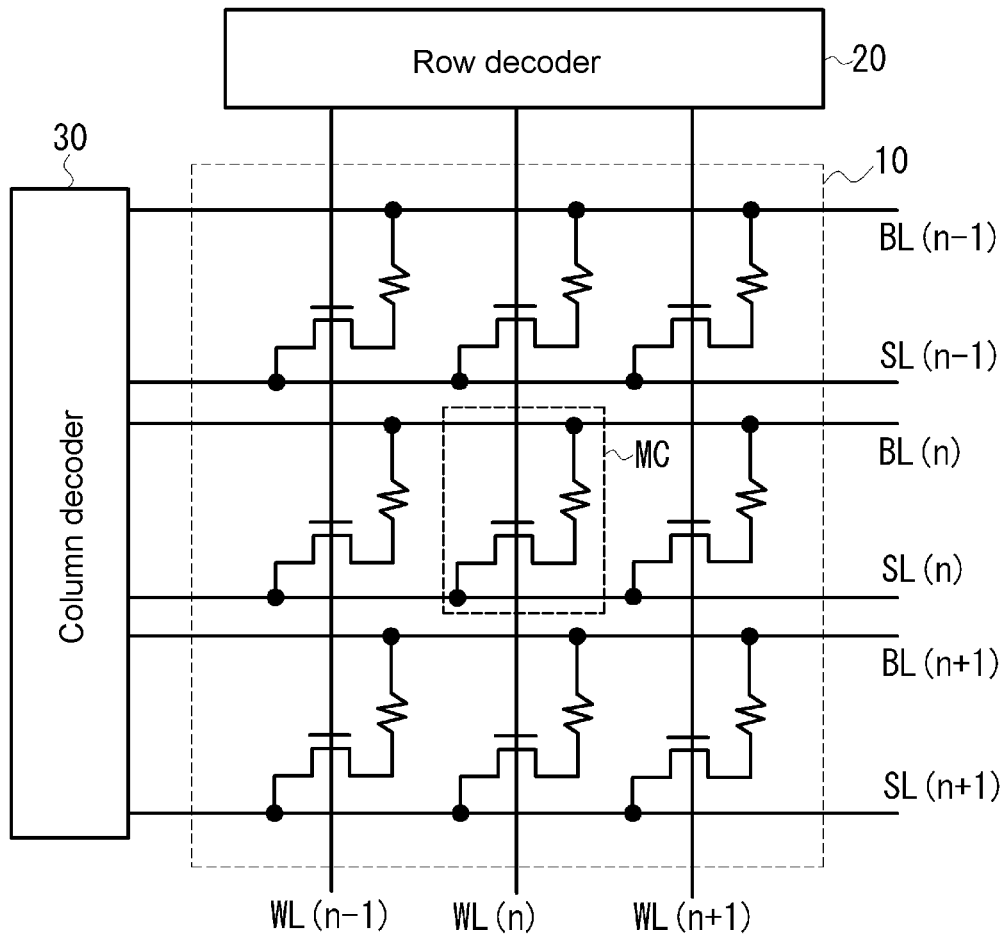
FIG. 1A is a diagram showing an array configuration of a conventional variable resistance random access memory.
FIG. 1B is a table showing the selected bias conditions during each operation.
Figure 2:
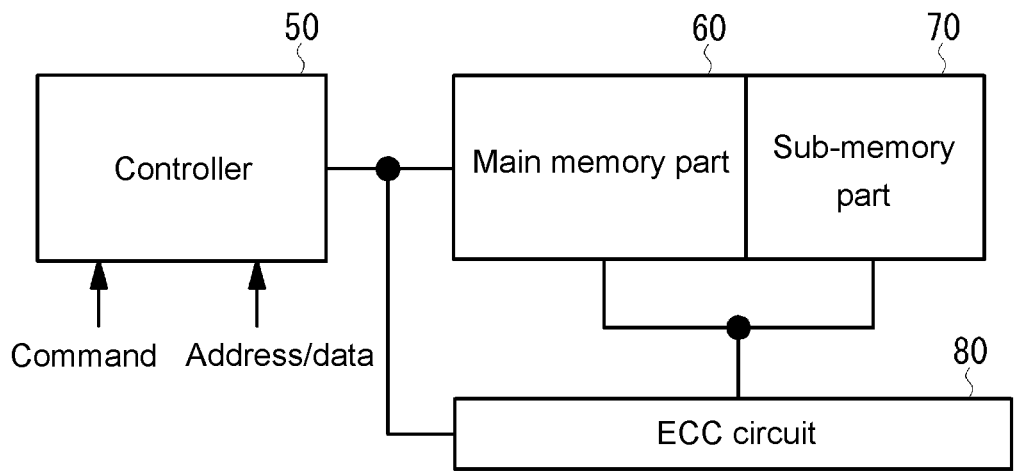
FIG. 2 is a block diagram showing a schematic configuration of a conventional variable resistance memory.

The memory array 110 includes a main memory part 110A for storing input data from the outside and a sub-memory part 110B for storing an error correction code of the input data generated by the ECC circuit 150. As shown in FIG. 1A, each memory cell may have a configuration of 1T×1R including one variable resistance element and one transistor, or each memory cell may have a configuration of 2T×2R which includes a pair of transistors and a pair of variable resistance elements connected in series between a pair of bit lines and stores complementary data in the pair of variable resistance elements.

In addition to a column decoder for selecting the bit line and the source line based on the column address, the column selection circuit 130 includes a sense amplifier for sensing data read from a memory cell via the bit line and the source line, and a write driver/read bias circuit for applying a bias voltage for a read operation via the bit line and the source line and applying a write pulse voltage according to SET or RESET for a write operation. The sense amplifier is connected to the ECC circuit 150 via an internal data bus, and it is possible to perform bi-directional data transfer between the sense amplifier and the ECC circuit 150. In the case of the configuration of 1T×1R, the sense amplifier compares the current or voltage flowing between the bit line and the source line of the selected variable resistance element with a reference value to determine data "0" and "1". In the case of 2T×2R, the sense amplifier uses a difference signal between the pair of the corresponding bit lines to determine data "0" and "1".

The ECC circuit 150 can be enabled or disabled, for example, by a command or shipping setting, etc. In the case where an on-chip ECC function is enabled, input data from the outside at the time of a write operation is loaded into the sense amplifier and the written data is transferred from the sense amplifier to the ECC circuit 150. The ECC circuit 150 calculates the transferred written data and generates an error correction code. The ECC operation is executed by a known method such as parity check, Hamming code, Reed-Solomon, etc., and converts the input data of k bits or k bytes to p=k+q, wherein "q" represents the error correction code or a parity bit necessary for error detection and correction of data. The error correction code generated by the ECC circuit 150 is transferred to the sense amplifier and written in the sub-memory part 110B.

In a read operation, the data read from the memory array 110 is held in the sense amplifier, and the sense amplifier transfers the held data to the ECC circuit 150. The ECC circuit 150 detects an error of the read data based on the error correction code and writes corrected data back to the sense amplifier when an error is detected, and finally, the data held in the sense amplifier is outputted to the outside.

The error bit flag register 160 stores a flag indicating existence of an error bit when failure is determined in the verification during the write operation. For example, if an error bit exists, the value of the corresponding bit of the flag is set "1". The error bit flag register 160 configures the number of flags according to the predetermined number of error bits that can be recovered. The number of error bits that can be recovered can be set to any value, and by increasing this number of error bits that can be recovered, it is possible to reduce the number of bits that the ECC circuit 150 can correct. In addition, the error bit flag register 160 can include a write identify code indicating the error bit occurs in SET or in RESET.

The error bit address register 170 stores the address of the error bit when the flag of the error bit is set. When flags of multiple error bits are set, the error bit address register 170 stores these addresses that are respectively corresponded by these error bits.

The controller 140 receives a command from the outside such as a host device and controls a read operation or a write operation based on the command. In an embodiment, the controller 140 includes a central processing unit (CPU) and a read-only memory (ROM)/random access memory (RAM) storing a program for controlling the read operation and the write operation, and the CPU executes the program stored in the ROM according to the command from the outside.

FIG. 4 shows an example of a command processing sequence performed by the controller 140. Upon receiving a command or the like from the outside via the I/O buffer or the like (S100), the controller 140 decodes the command (S110). If the command is a write command, a write operation is executed (S120), and if the command is a read command, a read operation is executed (S130).

Here, it is known that, the variable resistance element in the variable resistance memory performs unstably as the number of SET/RESET write cycles increases. For example, the variable resistance element may not be set to the low resistance state during the write operation of SET. However, if the data of the variable resistance element having such failure is rewritten, the variable resistance element may be recovered to the original stable state.

FIG. 5A is a graph showing a relationship between the number of SET/RESET write cycles and the state of the variable resistance element. White circles correspond to SET, and black circles correspond to RESET. FIG. 5B is an enlarged view of a vicinity of about $1.7 \times 10^5$ cycles. It is known that, in the vicinity of about $1.0 \times 10^5$ cycles, in spite of writing of SET, the variable resistance element is still in the high resistance state. In other words, the variable resistance element is unstable, and the variable resistance element having such failure is called an error bit. It should be noted that the unstable status of the variable resistance element may be recovered to the original stable state through rewriting (RESET then SET if the variable resistance element fails in SET, and SET then RESET if the variable resistance element fails in RESET).

If the number of memory cells that fail, that is, the number of error bits, exceeds the maximum number of bits that can be corrected by the ECC circuit 150, it is impossible to correct all the data. Also, the number of error bits tends to increase with the increase of the endurance cycles. Therefore, the R&D in the field hopes the error bits can be recovered as early as possible.

For this reason, the variable resistance random-access memory 100 of the present embodiment has the function of recovering error bits. Specifically, the controller 140 executes a program for recovering error bits.

Figures 6, 7:
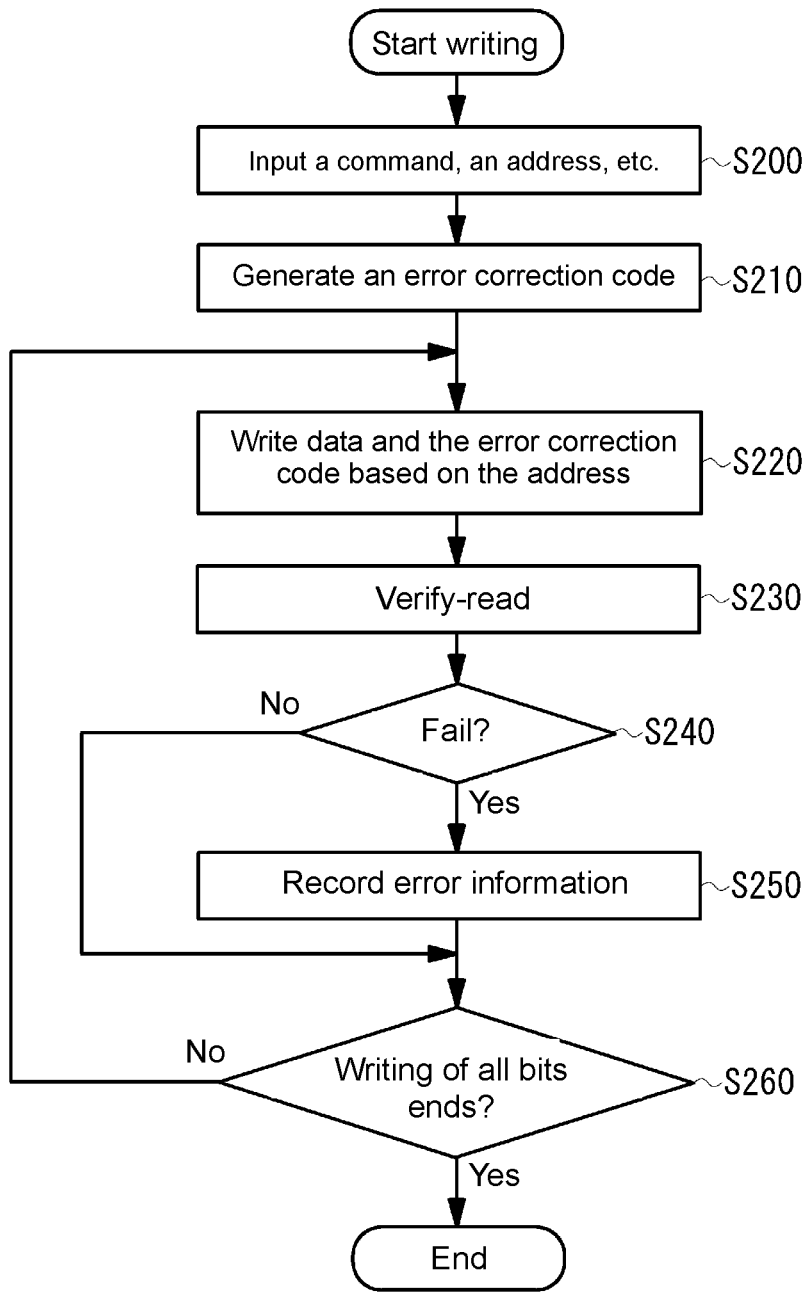
FIG. 6 is a flowchart illustrating a write operation having an error bit recovering function according to an embodiment of the disclosure.
FIG. 7 is a diagram showing an example of storage of an error bit flag register.

FIG. 6 is a flowchart illustrating a sequence of a write operation having the error bit recovering function of the variable resistance memory according to the present embodiment. The controller 140 starts a write operation in response to a command or the like input from the outside (S200), and the ECC circuit 150 performs the ECC operation on the input data to generate the error correction code (S210). The row selection circuit 120 and the column selection circuit 130 select a memory cell of the main memory part 110A and the sub-memory part 110B according to the input address, and the write driver/read bias circuit performs writing of SET or RESET on the selected memory cell (S220). The write driver/read bias circuit writes the data (e.g. the unit is byte) to the selected memory cell, and the sense amplifier holds the written data.

Upon completion of data writing, the controller 140 then verify-reads the written data stored in the selected memory cell via the write driver/read bias circuit (S230). The controller 140 determines whether the written data is correctly written or not (S240). In detail, the controller 140 compares the data read from the selected memory cell with the input data, and determines the written data as pass if the two data match, and determines the written data as failure if the two data do not match. If the written data is determined as failure, the controller 140 sets a flag indicating that the selected memory cell is an error bit in the error bit flag register 160 and stores the address of the selected memory cell in the error bit address register 170 (S250). On the other hand, in the case of being determined as pass in the verification, S250 may not be executed, and the controller 140 determines whether all bits of the input data have finished writing (S260). If all bits of the input data have finished writing, the write operation may be end, or otherwise back to S220.

FIG. 7 shows an example of bits stored in the error bit flag register. In this example, the number of the error bits that can be recovered is set as n bits, and hence the error bit flag register 160 stores n flags where each flag includes the bits indicating whether the written data having error. Whether the written data having failure is indicated based on the value of each bit in this disclosure. For instance, when the value of the bit indicating whether the written data having error is "1", it indicates the corresponding written data having error (i.e. failure); when the value of the bit indicating whether the written data having error is "0", it indicates the corresponding written data having no error (i.e. write correctly). Moreover, the n flags of the error bit flag register 160 include bits indicating the write identification. In the embodiment, when the value of the bit indicating the write identification is "1", it indicates the writing of SET, and the value "0" indicates the writing of RESET. In the example of FIG. 7, the flag 1 indicates that an error bit occurs at the time of RESET of a selected memory cell, the flag 2 indicates that an error bit occurs at the time of SET of a selected memory cell, and the flag n indicates that no failure occurs in a selected memory cell at the time of writing RESET. In the embodiment, each of the flags 1 to n has 2 bits, but flag bits may be added for storing other required attribute data.

Figures 8, 9:
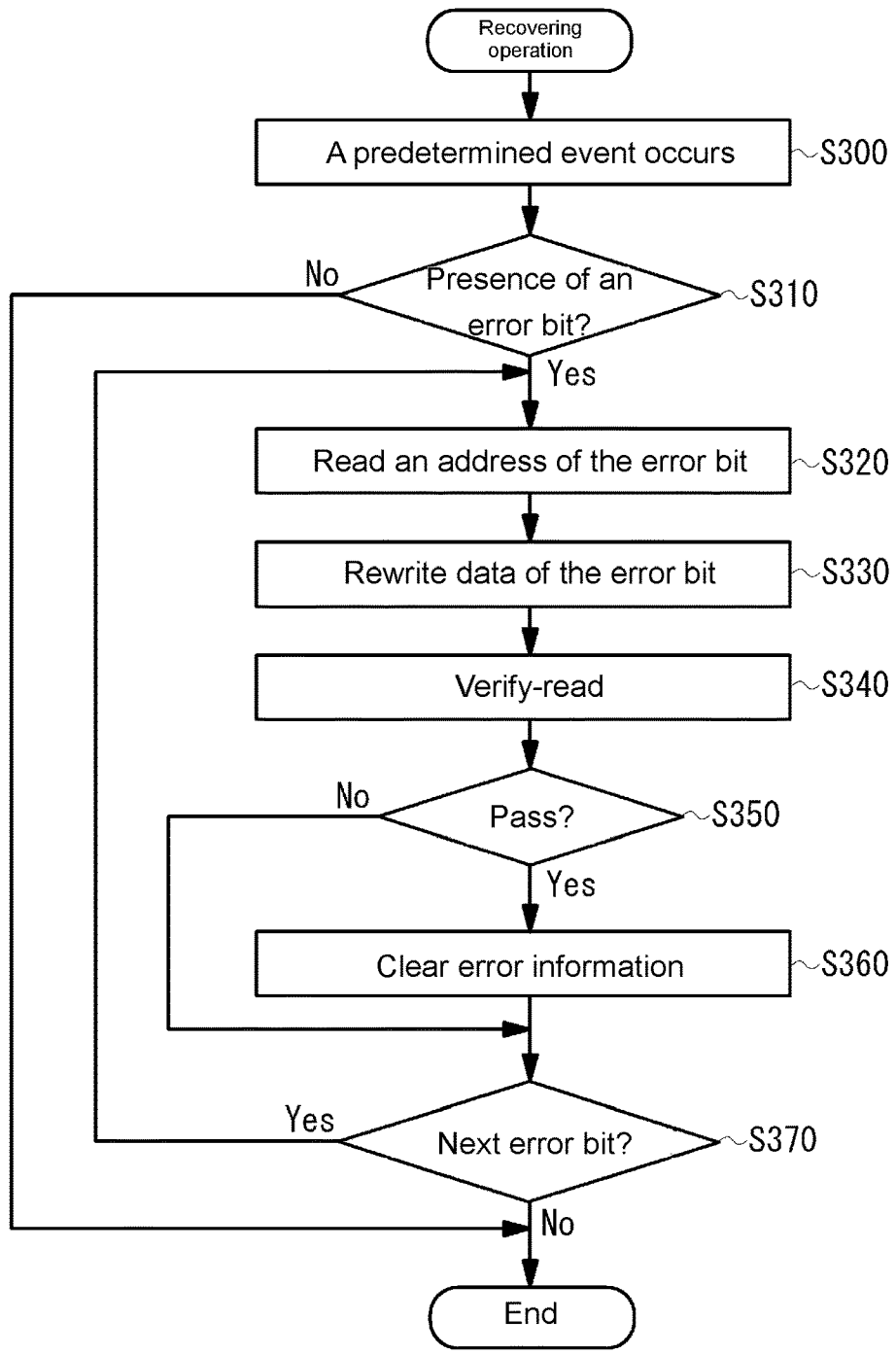
FIG. 8 is a diagram showing an example of storage of an error bit address register.
FIG. 9 is a flowchart illustrating a recovering operation of an error bit according to an embodiment of the disclosure.

FIG. 8 shows an example of addresses stored in the error bit address register. As shown in the figure, when the flag stored in the error bit flag register 160 indicates the written data having error, the error bit address register 170 will correspondingly store the address of the error bit. In the example of FIG. 7, since the value of the bit indicating whether the written data having error is "1" in the flag 1 and the flag 2 both, the error bit address register 170 will correspondingly store the addresses of the error bits ADxxx1, ADxxx2.

Next, a recovering operation on an error bit of this embodiment will be described with reference to the flowchart of FIG. 9. The error bit can be recovered in any operation of the variable resistance memory. In the present embodiment, the recovery operation of the error bit is enabled when a predetermined event occurs. For example, the predetermined event may be during a read operation, during a write operation, when a power supply voltage is input, etc.

When the predetermined event occurs (S300), the controller 140 starts to recover the error bit. The predetermined event is, for example, a read operation. The controller 140 performs the recovering operation when receiving a read command from the outside. Wherein the recovering operation is executed in a manner of not conflicting with the predetermined event. For example, the recovering operation is executed after the read operation ends, or the recovering operation is executed in the background in parallel with the read operation.

When the recovering operation is started, the controller 140 refers to the value of the flag stored in the error bit flag register 160 to determine whether or not occurrence of an error bit in the current writing data (S310). Taking FIG. 7 as an example, the controller 140 determines whether the value "1" of each flag that indicates the written data having error bit exists. If the value that indicates the error bit exists in the flag, the controller 140 controls to read the address of the corresponding error bit from the error bit address register 170 (S320). Next, the controller 140 selects the error bit via the row selection circuit 120 and the column selection circuit 130 according to the address of the error bit, and rewrites the data of the error bit via the write driver/read bias circuit (S330). Based on the value of the bit indicating the identification of writing shown in FIG. 7, for an error bit of write SET failure, the controller 140 performs RESET and then SET on the error bit, and for an error bit of write RESET failure, the controller 140 performs SET and then RESET on the error bit.

Next, the controller 140 executes a verify-read operation on the error bit via the write driver/read bias circuit (S340). The controller 140 compares data read from the error bit with an expected value. If the read data and the expected value match, the controller 140 determines the rewritten data as pass, and if the read data and the expected value do not match, the controller 140 determines the data as failure (S350). If the controller 140 determines the rewritten data as pass, error information regarding the error bit is cleared from the error bit flat register 160 and the error bit address register 170 since the error bit has been recovered to the original memory cell that can store stably by rewriting the data (S360). In other words, taking FIG. 7 as an example, the bit of the flag indicating presence or absence of an error is cleared to "0", the corresponding bit of the flag indicating the write identification is cleared to "0", and the error bit address in FIG. 8 is cleared to "0". On the other hand, if the controller 140 determines the read data as failure, since the error bit after rewriting is still erroneous, the error information remains held in the registers 160 and 170.

In the case where there is still a remaining error bit as the target of recovery (S370), the controller 140 repeats the above-described steps S320 to S360, and the controller 140 terminates the process when there is no error bit.

In an embodiment, when the controller 140 determines that the rewritten data is failure, EEC circuit 150 determines the number of the rewritten data that is failure in the written data. When the number of the rewritten data that is failure in the written data is not large than a predetermined vale, EEC circuit 150 performs error checking and correcting for the selected memory cell.

As described above, according to the present embodiment, by holding the error information of the error bit in a write operation and rewriting the data of the error bit by referring to the error information in any operation thereafter, it is possible to recover or cure the error bit at the earliest possible timing. If the number of error bits that can be recovered increases, it can be expected to reduce the maximum number of bits that can be corrected by the ECC circuit 150 accordingly. As a result, it is possible to suppress degradation of performance which comes with the ECC operation and further achieve high integration of a memory chip by reducing the area occupied by the ECC circuit.

Another embodiment of the disclosure will be described in the following. In the above embodiment, the error bit is recovered when the predetermined event occurs. However, there may be error bits that can no longer be recovered in the written data. In other words, such an error bit is permanent in which the endurance characteristic is completely worn out.

In this another embodiment, the variable resistance random-access memory 100 includes a counter that records the number of times of recovery of an error bit. When the error bit after repairing is determined still failure and when the value of the counter configured to record the repaired times of the error bit has reached the predetermined value, the controller 140 may clear the error information in the registers 160 and 170 and replace the error bit with a redundant memory cell. The redundant memory cells may be prepared in advance in the memory array 110.

Furthermore, as a modification example of this embodiment, when the memory array 110 has redundant memory cells for replacing the permanent error bit, the on-chip ECC circuit may be completely eliminated. In other words, by recovering the error bits and replacing an error bit that cannot be recovered through the preset number of times of recovery with a redundant memory cell, the ECC circuit may be completely eliminated (i.e. omit to configure the EEC circuit) and then the area may be reduced.

Although the embodiment of the disclosure has been described in detail, the disclosure is not limited to a specific embodiment and various modifications and changes are possible within the scope of the disclosure disclosed in the claims.

What is claimed is:

1. A variable resistance random-access memory, comprising:
    a variable resistance random-access memory array comprising a plurality of memory cells;
    an error bit flag register, configured to store a flag data and a write identify code, wherein the flag data indicates an occurrence of an error bit when a written memory cell of the plurality of memory cells is determined as failure and the write identify code indicates whether the occurrence of the error bit is in writing of SET or in writing of RESET;
    a failure information holding element, configured to hold failure information comprising an address of the written memory cell determined as failure; and
    a controller configured to perform:
        writing a memory cell selected based on address information to be a predetermined resistance state;
        determining the written memory cell as pass if the written memory cell matches the predetermined resistance state or failure if the written memory cell does not match the predetermined resistance state; and
        when a predetermined event occurs, reading the address of the written memory cell determined as failure from the failure information holding element based on the flag data, selecting the written memory cell determined as failure based on the address, and recovering the memory cell determined as failure based on the write identify code, wherein the controller performs the recovering by performing a first rewriting operation and a second rewriting operation to the memory cell determined as failure.

2. The variable resistance random-access memory according to claim 1, wherein the predetermined resistance state is low resistance state, the failure information further comprises a bit for identification of the writing of SET, and the controller is configured to perform the recovering by rewriting of RESET and then rewriting of SET on the written memory cell determined as failure.

3. The variable resistance random-access memory according to claim 1, wherein the predetermined resistance state is high resistance state, the failure information further comprises a bit for identification of the writing of RESET, and the controller is configured to perform the recovering by rewriting of SET and then rewriting of RESET on the written memory cell determined as failure.

4. The variable resistance random-access memory according to claim 1, wherein the controller is further configured to determine the recovered memory cell as pass or failure, and if the recovered memory cell is determined as pass, the controller is further configured to clear the flag data and the write identify code stored in the error bit flag register and to clear the address of the written memory cell determined as failure held in the failure information holding element.

5. The variable resistance random-access memory according to claim 4, wherein the controller is further configured to repeat the recovering on the recovered memory cell determined as failure, and set the recovered memory cell determined as failure as unrecoverable and replace the unrecoverable memory cell with a redundant memory cell if the times of the recovering is equal to or greater than a preset value and the recovered memory cell still does not match the predetermined resistance state.

6. The variable resistance random-access memory according to claim 4, further comprising an error correction/detection circuit, wherein when the controller determines the recovered memory cell as failure and the error correction/detection circuit determines the number of the recovered memory cell determined as failure, the error correction/detection circuit is configure to execute error connection/detection on the recovered memory cell determined as failure if the number of the recovered memory cell determined as failure is not greater than a preset value.

7. The variable resistance random-access memory according to claim 1, wherein the predetermined event is a read operation.

8. The variable resistance random-access memory according to claim 1, wherein the predetermined event is a write operation.

9. The variable resistance random-access memory according to claim 1, wherein the predetermined event is inputting of power.

10. The variable resistance random-access memory according to claim 1, wherein the controller is configured to perform the recovering in background of the predetermined event.

11. A method for a write operation having the error bit recovering function of a variable resistance random-access memory, the method comprising:
    writing a memory cell of the variable resistance random-access memory selected based on address information to be a predetermined resistance state;
    determining the written memory cell as pass if the written memory cell matches the predetermined resistance state or failure if the written memory cell does not match the predetermined resistance state;
    holding failure information comprising an address of the written memory cell determined as failure in a failure information holding element;
    storing a flag data and a write identify code, wherein the flag data indicates an occurrence of an error bit when a written memory cell is determined as failure and the write identify code indicates whether the occurrence of the error bit is in writing of SET or in writing of RESET; and
    when a predetermined event occurs, when a predetermined event occurs, reading the address of the written memory cell determined as failure based on the flag data, selecting the written memory cell determined as failure based on the address, and recovering the memory cell determined as failure based on the write identify code, wherein recovering the memory cell determined as failure comprises performing a first rewriting operation and a second rewriting operation to the memory cell determined as failure.

12. The method according to claim 11, wherein the predetermined resistance state is low resistance state, the failure information further comprises a bit for identification of the writing of SET, and the recovering includes rewriting of RESET and then rewriting of SET on the written memory cell determined as failure.

13. The method according to claim 11, wherein the predetermined resistance state is high resistance state, the failure information further comprises a bit for identification of the writing of RESET, and the recovering includes rewriting of SET and then rewriting of RESET on the written memory cell determined as failure.

14. The method according to claim 11, further comprising determining the recovered memory cell as pass or failure, and if the recovered memory cell is determined as pass, clearing the flag data and the write identify code stored in the error bit flag register and clearing the failure information held in the failure information holding element.

15. The method according to claim 14, further comprising repeating the recovering, setting the recovered memory cell determined as failure as unrecoverable and replacing the unrecoverable memory cell with a redundant memory cell, if the times of the recovering is equal to or greater than a preset value and the recovered memory cell still does not match the predetermined resistance state.

16. The method according to claim 14, wherein the variable resistance random-access memory further comprises an error correction/detection circuit, when the recovered memory cell is determined as failure and the method further comprises determining the number of the recovered memory cell determined as failure by the error correction/detection circuit, and executing error correction/detection on the recovered memory cell determined as failure by the error connection/detection circuit if the number of the recovered memory cell determined as failure is not greater than a preset value.

17. The method according to claim 11, wherein the predetermined event is a read operation.

18. The method according to claim 11, wherein the predetermined event is a write operation.

19. The method according to claim 11, wherein the predetermined event is inputting of power.

20. The method according to claim 11, wherein the recovering is performed in background of the predetermined event.

* * * * *